(12) United States Patent
Seo

(10) Patent No.: US 11,031,086 B2
(45) Date of Patent: Jun. 8, 2021

(54) SEMICONDUCTOR MEMORY AND OPERATING METHOD THEREOF

(71) Applicant: SK hynix Inc., Icheon-si (KR)

(72) Inventor: Moon Sik Seo, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/867,257

(22) Filed: May 5, 2020

(65) Prior Publication Data
US 2021/0104281 A1     Apr. 8, 2021

(30) Foreign Application Priority Data

Oct. 2, 2019     (KR) .......................... 10-2019-0122538

(51) Int. Cl.
| | |
|---|---|
| G11C 16/10 | (2006.01) |
| G11C 16/16 | (2006.01) |
| G11C 16/12 | (2006.01) |
| G11C 16/04 | (2006.01) |
| G11C 16/08 | (2006.01) |
| G11C 16/24 | (2006.01) |
| G11C 16/30 | (2006.01) |

(52) U.S. Cl.
CPC .......... *G11C 16/16* (2013.01); *G11C 16/0433* (2013.01); *G11C 16/08* (2013.01); *G11C 16/12* (2013.01); *G11C 16/24* (2013.01); *G11C 16/30* (2013.01)

(58) Field of Classification Search
CPC ...... G11C 16/16; G11C 16/14; G11C 16/3445
USPC ....................... 365/185.29, 185.26
See application file for complete search history.

(56) References Cited

U.S. PATENT DOCUMENTS

2015/0155047 A1* 6/2015 Kim ................. G11C 16/14
365/185.29

FOREIGN PATENT DOCUMENTS

| KR | 1020110038117 A | 4/2011 |
|---|---|---|
| KR | 1020130008275 A | 1/2013 |
| KR | 1020140026150 A | 3/2014 |

\* cited by examiner

*Primary Examiner* — Jason Lappas
(74) *Attorney, Agent, or Firm* — William Park & Associates Ltd.

(57) ABSTRACT

There are provided a semiconductor memory and an operating method thereof. The semiconductor memory includes: a memory block including a plurality of pages; a peripheral circuit for performing a first erase operation, a program operation, and a second erase operation on the memory block in a write operation on the memory block; and control logic for controlling the peripheral circuit to perform the write operation. The control logic is configured to control the peripheral circuit to erase a plurality of memory cells included in the memory block to a pre-erase state having a threshold voltage higher than a threshold voltage of a target erase state in the first erase operation, and controls the peripheral circuit to erase some memory cells among the plurality of memory cells to the target erase state in the second erase operation.

18 Claims, 12 Drawing Sheets

SEMICONDUCTOR MEMORY AND OPERATING METHOD THEREOF

CROSS-REFERENCE TO RELATED APPLICATION

The present application claims priority under 35 U.S.C. § 119(a) to Korean patent application number 10-2019-0122538 filed on Oct. 2, 2019, the entire disclosure of which is incorporated herein by reference.

BACKGROUND

1. Technical Field

The present disclosure generally relates to an electronic device, and more particularly, to a semiconductor memory and an operating method thereof.

2. Related Art

The paradigm on recent computer environment has been turned into ubiquitous computing environment in which computing systems can be used anywhere and anytime. This promotes increasing usage of portable electronic devices such as mobile phones, digital cameras, notebook computers, and the like. Such portable electronic devices may generally include a memory system using a semiconductor memory device, i.e., a data storage device. The data storage device is used as a main memory device or an auxiliary memory device of the portable electronic devices.

A data storage device using a semiconductor memory device has excellent stability and durability, high information access speed, and low power consumption, because there is no mechanical driving part. In an example of memory systems having such advantages, the data storage device includes a Universal Serial Bus (USB) memory device, memory cards having various interfaces, a Solid State Drive (SSD), and the like.

Semiconductor memory devices are generally classified as volatile memory devices or nonvolatile memory devices.

A nonvolatile memory device has relatively slow write and read speeds, but retains stored data even when a supply of power is interrupted. Thus, the nonvolatile memory device is used to store data to be retained regardless of whether power is supplied.

Examples of the volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. Flash memory is classified as NOR type flash memory as NAND type flash memory.

SUMMARY

In accordance with an embodiment of the present disclosure, a semiconductor memory includes: a memory block including a plurality of pages; a peripheral circuit configured to perform a first erase operation, a program operation, and a second erase operation on the memory block in a write operation on the memory block; and control logic configured to control the peripheral circuit to perform the write operation. The control logic controls the peripheral circuit to erase a plurality of memory cells included in the memory block to a pre-erase state having a threshold voltage higher than a threshold voltage of a target erase state in the first erase operation, and controls the peripheral circuit to erase some memory cells among the plurality of memory cells to the target erase state in the second erase operation.

In accordance with another embodiment of the present disclosure, a method for operating a semiconductor memory includes: performing a first erase operation on a memory block including a plurality of pages; performing a program operation on a selected pages among the plurality of pages; and performing a second erase operation on some memory cells among memory cells included in the selected page. Memory cells included in the memory block are erased to a pre-erase state in the first erase operation, and the some memory cells are erased to a target erase state in the second erase operation.

In accordance with still another embodiment of the present disclosure, a method for operating a semiconductor memory includes: providing a memory block including a plurality of pages, wherein each of the plurality of pages includes memory cells programmed to a pre-erase state and a plurality of program states; applying an erase voltage to first bit lines coupled to first memory cells corresponding to the pre-erase state among the memory cells included in a selected page among the plurality of pages; applying an erase operation voltage to a drain select line of the memory block; and erasing the first memory cells included in the selected page to a target erase state having a threshold voltage distribution lower than a threshold voltage distribution of the pre-erase state by applying a ground voltage to a selected word line corresponding to the selected page.

BRIEF DESCRIPTION OF THE DRAWINGS

Example embodiments will now be described hereinafter with reference to the accompanying drawings; however, they may be embodied in different forms and should not be construed as being limited to the embodiments set forth herein. Rather, these embodiments are provided so that this disclosure will be enabling, and will convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Hereinafter, embodiments of the present disclosure will be described in detail with reference to the accompanying drawings in order for those skilled in the art to be able to readily implement the technical spirit of the present disclosure.

Various embodiments provide a semiconductor memory capable of improving data reliability and an operating method of the semiconductor memory.

Figure 1:
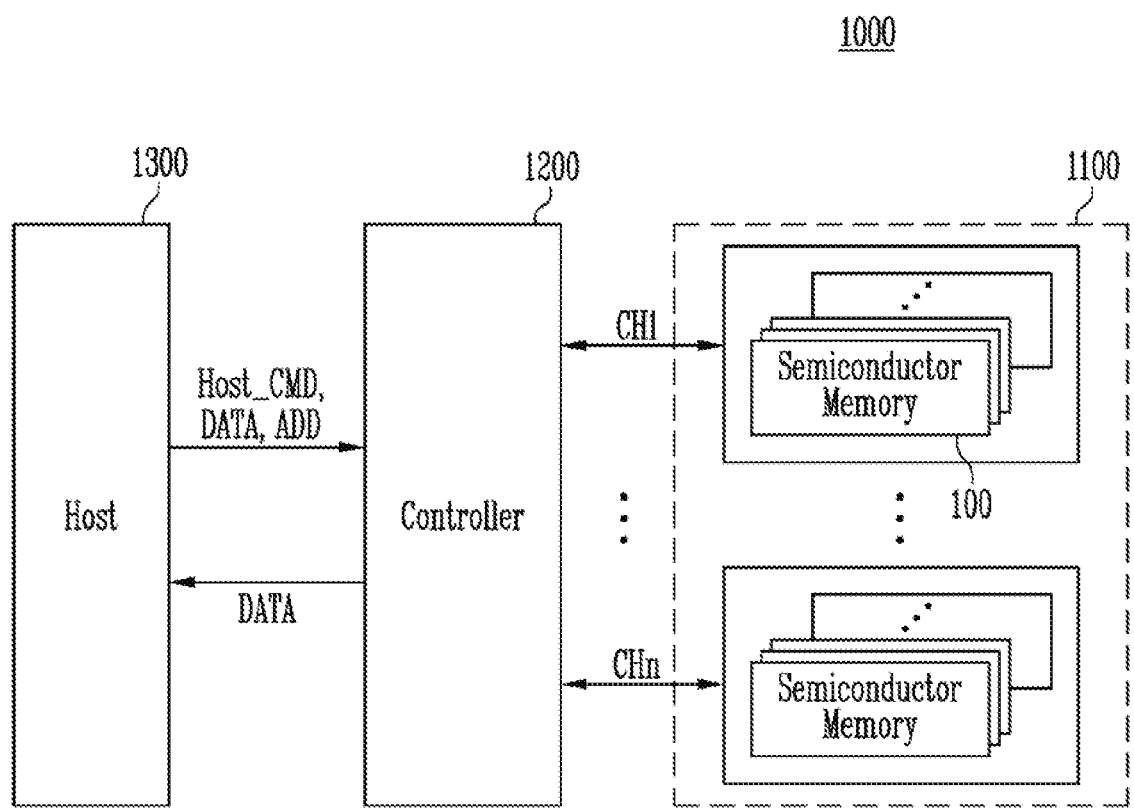
FIG. 1 is a block diagram illustrating a memory system including a semiconductor memory in accordance with an embodiment of the present disclosure.

FIG. 1 is a block diagram illustrating a memory system 1000 including a semiconductor memory 100 in accordance with an embodiment of the present disclosure.

Referring to FIG. 1, the memory system 1000 includes a memory device 1100, a controller 1200, and a host 1300. The memory device 1100 includes a plurality of semiconductor memories 100. The plurality of semiconductor memories 100 may be divided into a plurality of groups. Although a case where the host 1300 is included in the memory system 1000 is illustrated and described in an embodiment of the present disclosure, the memory system 1000 may include only the controller 1200 and the memory device 1100, and the host 1300 may be disposed at the outside of the memory system 1000.

In FIG. 1, a case where the plurality of groups of the memory device 1100 communicate with the controller 1200 respectively through first to nth channels CH1 to CHn is illustrated. Each semiconductor memory 100 will be described later with reference to FIG. 2.

Each group communicates with the controller 1200 through one common channel. The controller 1200 controls the plurality of semiconductor memories 100 of the memory device 1100 through the plurality of channels CH1 to CHn.

In an embodiment of the present disclosure, in a write operation, the plurality of semiconductor memories 100 included in the memory device 1100 may perform a first erase operation on a selected memory block, and perform a program operation on the selected memory block after the first erase operation. In the first erase operation, memory cells included in the selected memory block may be erased to a pre-erase level. The plurality of semiconductor memories 100 may perform a second erase operation on the selected memory block after the program operation is completed. In the second erase operation, memory cells corresponding to an erase state among the memory cells included in the selected memory block may be erased to a target erase level. The target erase level may be a level lower than the pre-erase level.

The controller 1200 is coupled between the host 1300 and the memory device 1100. The controller 1200 accesses the memory device 1100 in response to a request from the host 1300. For example, the controller 1200 controls read, write, erase, and background operations of the memory device 1100 in response to a host command Host_CMD received from the host 1300. In a write operation, the host 1300 may transmit an address ADD and data DATA together with the host command Host_CMD. In a read operation, the host 1300 may transmit an address ADD together with the host command Host_CMD. In a write operation, the controller 1200 transmits, to the memory device 1100, a command corresponding to the write operation and data DATA to be programmed. In a read operation, the controller 1200 transmits a command corresponding to the read operation to the memory device 1100, receives read data DATA from the memory device 1100, and transmits the received data DATA to the host 1300. The controller 1200 provides an interface between the memory device 1100 and the host 1300. The controller 1200 drives firmware for controlling the memory device 1100.

The host 1300 includes portable electronic devices such as a computer, a PDA, a PMP, an MP3 player, a camera, a camcorder, and a mobile phone. The host 1300 may request a write operation, a read operation, an erase operation, etc. of the memory system 1000 through a host command Host_CMD. In order to perform a write operation of the memory device 1100, the host 1300 may transmit, to the controller 1200, a host command Host_CMD corresponding to the write operation, data DATA, and an address ADD. In order to perform a read operation of the memory device 1100, the host 1300 may transmit, to the controller 1200, a host command Host_CMD corresponding to the read operation and an address ADD. The address ADD may be a logical address.

The controller 1200 and the memory device 1100 may be integrated into one semiconductor memory device. In an embodiment, the controller 1200 and the memory device 1100 may be integrated into one semiconductor memory device, to constitute a memory card. For example, the controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms.

For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 2:
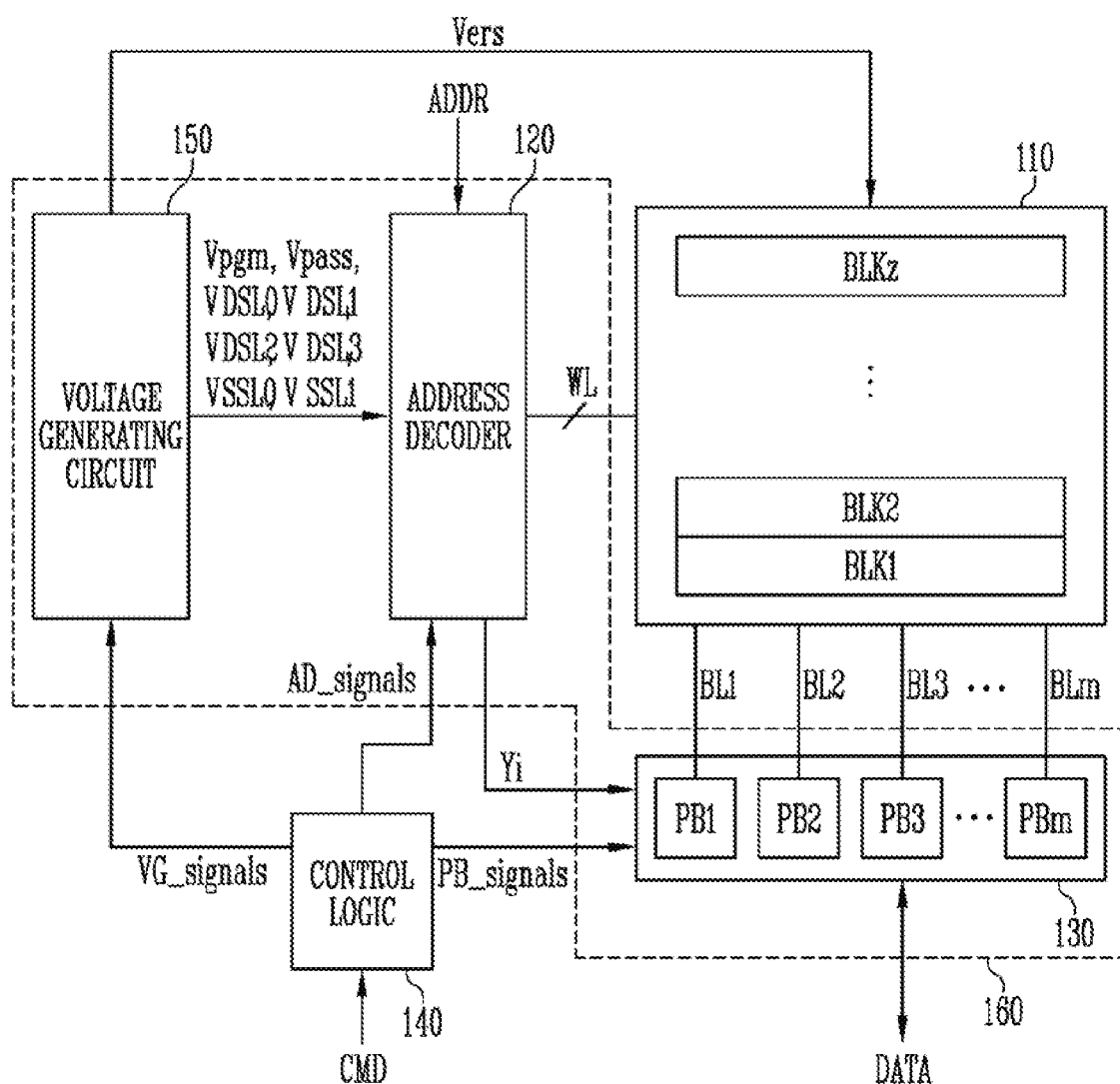
FIG. 2 is a diagram illustrating a semiconductor memory in accordance with an embodiment of the present disclosure.

FIG. 2 is a diagram illustrating a semiconductor memory in accordance with an embodiment of the present disclosure.

The semiconductor memory 100 in accordance with an embodiment of the present disclosure may perform a write operation when the semiconductor memory 100 receives a command CMD corresponding to the write operation from the controller 1200 shown in FIG. 1, and the write operation may include a first erase operation, a program operation, and a second erase operation.

Referring to FIG. 2, the semiconductor memory 100 includes a memory cell array 110, an address decoder 120, a read/write circuit 130, control logic 140, and a voltage generating circuit 150. The address decoder 120, the read/write circuit 130, and the voltage generating circuit 150 may be defined as a peripheral circuit 160 which performs a read operation on the memory cell array 110.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells may be nonvolatile memory cells. A plurality of memory cells coupled to one word line among the plurality of memory cells may be defined as one page. That is, the memory cell array 110 may be configured with a plurality of pages.

Each of the plurality of memory blocks BLK1 to BLKz of the memory cell array 110 includes a plurality of memory strings. Each of the plurality of memory strings includes a drain select transistor, a plurality of memory cells, and a source select transistor, which are coupled in series between a bit line and a source line. Also, each of the plurality of memory strings may include a pass transistor between the source select transistor and the memory cells and a pass transistor between the drain select transistor and the memory cells, and further include a pipe gate transistor between the memory cells. The memory cell array 110 will be described in detail later.

The address decoder 120 is coupled to the memory cell array 110 through the word lines WL. The address decoder 120 operates in response to address decoder control signals AD_signals generated by the control logic 140. The address decoder 120 receives an address ADDR through an input/output buffer (not shown) in the semiconductor memory 100.

The address decoder 120 may decode, to a row address in the received address ADD, a plurality of operation voltages including a program voltage Vpgm, a pass voltage Vpass, a plurality of drain select line voltages $V_{DSL0}$, $V_{DSL1}$, $V_{DSL2}$, and $V_{DSL3}$, and a plurality of source select line voltage $V_{SSL0}$ and $V_{SSL1}$, which are generated by the voltage generating circuit 150 during the program operation, and apply the plurality of operation voltages to a plurality of memory cells, drain select transistors, and source select transistors of the memory cell array 110 according to the decoded row address.

Also, the address decoder 120 may decode, to a row address in the received address ADDR, a plurality of operation voltages including a plurality of drain select line voltages $V_{DSL0}$, $V_{DSL1}$, $V_{DSL2}$, and $V_{DSL3}$ and a plurality of source select line voltages $V_{SSL0}$ and $V_{SSL1}$, which are generated by the voltage generating circuit 150 in the first and second erase operations, apply the plurality of operation voltages to drain select transistors and source select transistors of the memory cell array 110 according to the decoded row address, and apply a pass voltage Vpass or ground voltage to a plurality of memory cells of the memory cell array 110.

The address decoder 120 decodes a column address in the received address ADDR. The address decoder 120 transmits the decoded column address Yi to the read/write circuit 130.

An address ADDR received in the write operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The plurality of page buffers PB1 to PBm are coupled to the memory cell array 110 through the bit lines BL1 to BLm. The plurality of page buffers PB1 to PBm temporarily stores data DATA to be programmed, which is received from the controller 1200 shown in FIG. 2, in the program operation, and control voltage levels of the bit lines BL1 to BLm according to the temporarily stored data DATA.

Also, in a second erase operation, the read/write circuit 130 may apply an erase voltage to bit lines coupled to memory cells corresponding to an erase state among the bit lines BL1 to BLm, and apply a pass voltage to the other bit lines.

In an embodiment, the read/write circuit 130 may include page buffers (or page registers), a column select circuit, and the like.

The control logic 140 is coupled to the address decoder 120, the read/write circuit 130, and the voltage generating circuit 150. The control logic 140 receives a command CMD through the input/output buffer (not shown) of the semiconductor memory 100. The control logic 140 controls overall operations of the semiconductor memory 100 in response to the command CMD. For example, the control logic 140 receives a command CMD corresponding to a write command, and generates and outputs address decoder control signals AD_signals for controlling the address decoder 120, page buffer control signals PB_signals for controlling the read/write circuit 130, and voltage generating circuit control signals VG_signals for controlling the voltage generating circuit 150 in response to a received command CMD. The control logic 140 may be implemented as hardware, software, or a combination of hardware and software. For example, the control logic 140 may be a control logic circuit operating in accordance with an algorithm and/or a processor executing control logic code.

The control logic 140 in accordance with an embodiment of the present disclosure erases invalid data stored in a selected memory block in the write operation. The control logic 140 may control the peripheral circuit 160 to perform a first erase operation for erasing a threshold voltage of memory cells included in the selected memory block to a pre-erase level or less, a program operation for programming data DATA from the controller (1200 shown in FIG. 1) to the selected memory block, and a second erase operation for erasing a threshold voltage of memory cells corresponding to the erase state among the memory cells included in the selected memory block to a target level lower than the pre-erase level.

In the program operation, the voltage generating circuit 150 may generate a plurality of operation voltages including a program voltage Vpgm, a pass voltage Vpass, a plurality of drain select line voltages $V_{DSL0}$, $V_{DSL1}$, $V_{DSL2}$, and $V_{DSL3}$, and a plurality of source select line voltages $V_{SSL0}$ and $V_{SSL1}$, and output the plurality of operation voltages to the address decoder 120, under the voltage generating circuit control signals VG_signals output from the control logic 140. Also, in the first and second erase operations, the voltage generating circuit 150 may generate a plurality of operation voltages including a plurality of drain select line voltages $V_{DSL0}$, $V_{DSL1}$, $V_{DSL2}$, and $V_{DSL3}$ and a plurality of source select line voltages $V_{SSL0}$ and $V_{SSL1}$, and output the plurality of operation voltages to the address decoder 120. Also, in the first erase operation, the voltage generating circuit 150 may generate an erase voltage Vers, and apply the erase voltage Vers to a source line of the selected memory block.

Figure 3:
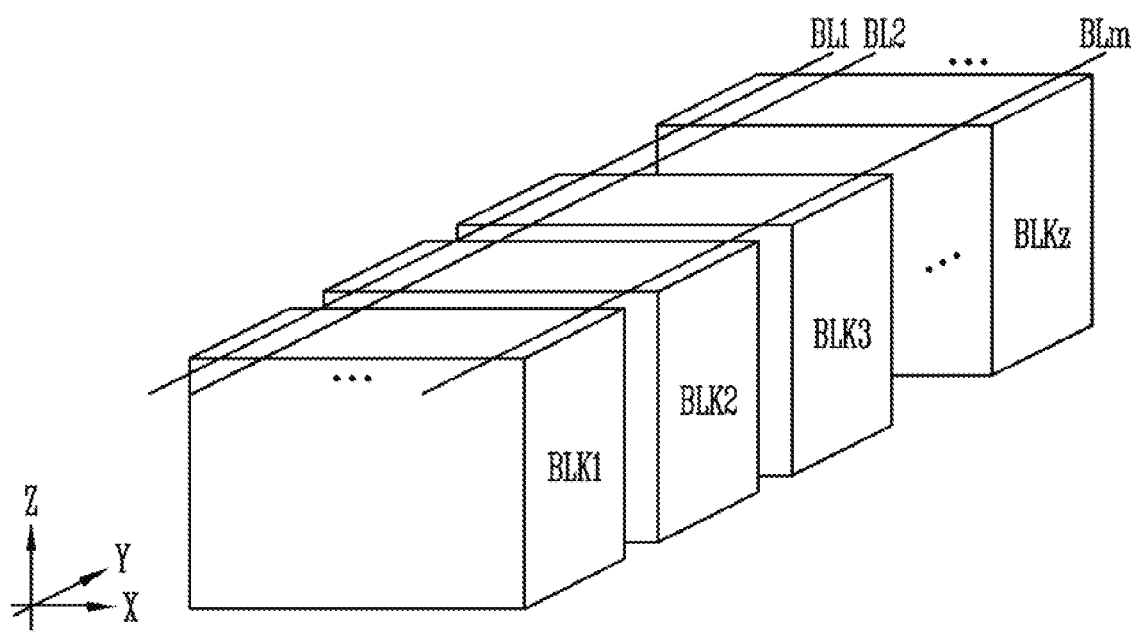
FIG. 3 is a diagram illustrating a three-dimensionally configured memory block.

FIG. 3 is a diagram illustrating a three-dimensionally configured memory block.

Referring to FIG. 3, the three-dimensionally configured memory blocks BLK1 to BLKz may be arranged to be spaced apart from each other along a direction Y in which bit lines BL1 to BLm extend. For example, first to zth memory blocks BLK1 to BLKz may be arranged to be spaced apart from each other along a second direction Y, and include a plurality of memory cells stacked along a third direction Z. A configuration of any one memory block among the first to zth memory blocks BLK1 to BLKz will be described in detail with reference to FIGS. 4 and 5.

Figure 4:
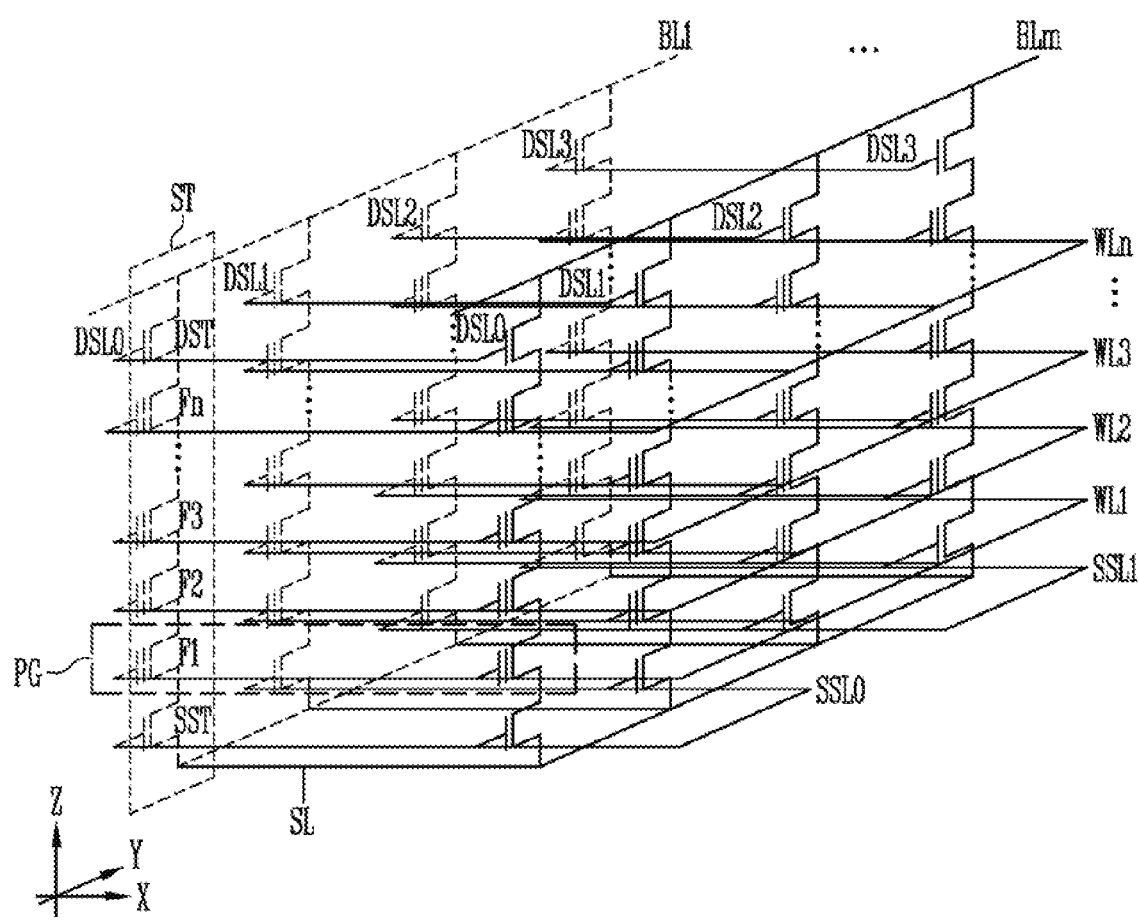
FIG. 4 is a circuit diagram illustrating in detail any one memory block shown in FIG. 3.

FIG. 4 is a circuit diagram illustrating in detail any one memory block shown in FIG. 3.

Figure 5:
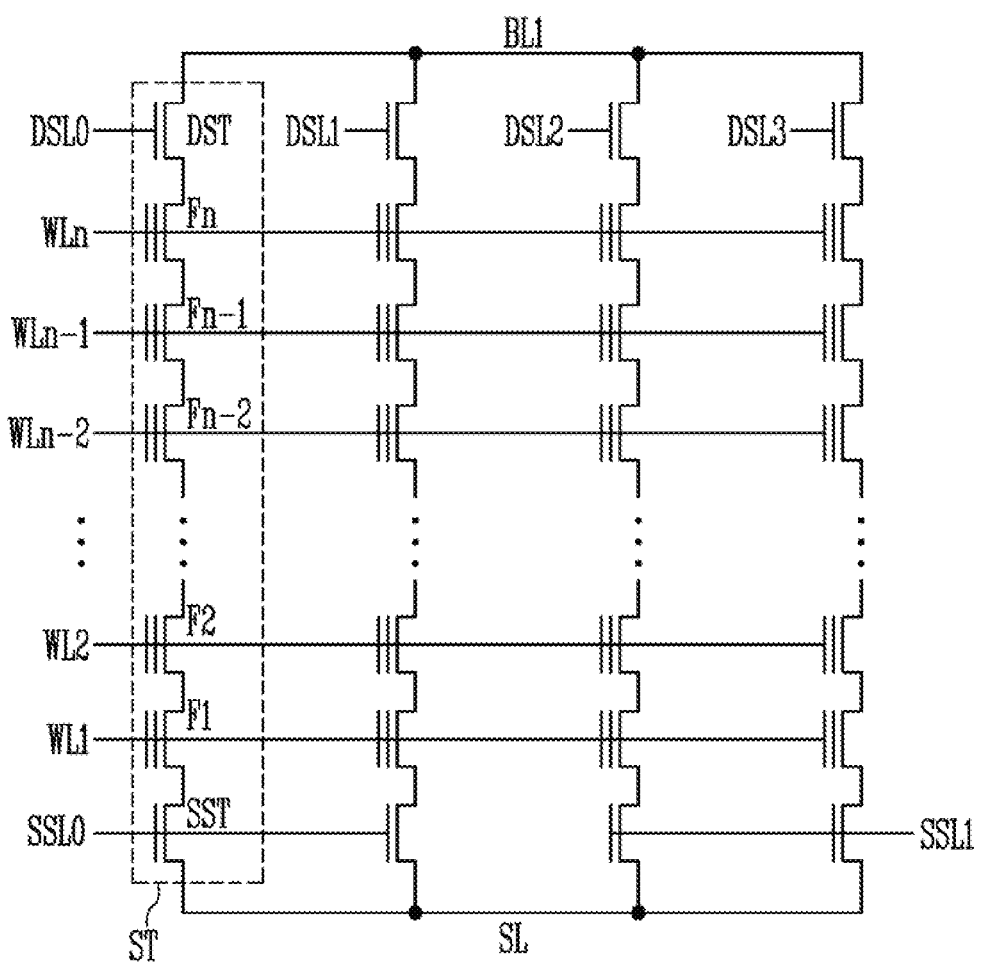
FIG. 5 is a circuit diagram illustrating memory strings shown in FIG. 4.

FIG. 5 is a circuit diagram illustrating memory strings shown in FIG. 4.

Referring to FIGS. 4 and 5, each memory string ST may be coupled between a corresponding bit line among bit lines BL1 to BLm and a source line SL. A memory string ST coupled between a first bit line BL1 and the source line SL will be described as an example.

The memory string ST may include a source select transistor SST, memory cells F1 to Fn (n is a positive integer), and a drain select transistor DST, which are coupled in series between the source line SL and the first bit line BL1. Gates of source select transistors SST included in different memory strings ST coupled to different bit lines BL1 to BLm may be coupled to a first source select line SSL0 and be coupled to a second source select line SSL1. In an example, source select transistors adjacent to each other in the second direction Y among the source select transistors SST may be coupled to the same source select line. For example, when assuming that source select transistors SST are sequentially arranged along the second direction Y, gates of source select transistors SST which are arranged in a first direction X from a first source select transistor SST and are included in different strings ST and gates of source select transistors SST which are arranged in the first direction X from a second source select transistor SST and are included in different strings ST may be coupled to the first source select line SSL0. In addition, gates of source select transistors SST which are arranged in the first direction X from a third source select transistor SST and are included in different strings ST and gates of source select transistors SST which are arranged in the first direction X from a fourth source select transistor SST and are included in different strings ST may be coupled to the second source select line SSL1.

Gates of the memory cells F1 to Fn may be coupled to word lines WL1 to WLn, and gates of drain select transistors DST may be coupled to any one of first to fourth drain select lines DSL0 to DSL3.

Gates of transistors arranged in the first direction X among the drain select transistors DST are commonly coupled to the same drain select line (e.g., DSL0), but transistors arranged in the second direction Y may be coupled to different drain select lines DSL1 to DSL3. For example, when assuming that drain select transistors DST are sequentially arranged along the second direction Y, gates of drain select transistors DST which are arranged in the first direction X from a first drain select transistor DST and are included in different strings ST may be coupled to the first drain select line DSL0. Drain select transistors DST arranged in the second direction Y from the drain select transistors DST coupled to the first drain select line DSL0 may be sequentially coupled to the second to fourth drain select lines DSL1 to DSL3. Therefore, in a selected memory block, memory strings ST coupled to a selected drain select line may be selected, and memory strings ST coupled to the other unselected drain selected lines may be unselected.

Memory cells coupled to the same word line may constitute one page PG. The page may mean a physical page. For example, a group of memory cells coupled in the first direction X on the same word line among the strings ST coupled to the first bit line BL1 to an mth bit line BLm is referred to as a page PG. For example, memory cells arranged in the first direction X among first memory cells F1 coupled to a first word line WL1 may constitute one page PG. Memory cells arranged in the second direction Y among the first memory cells F1 commonly coupled to the first word line WL1 may constitute another page. Therefore, when the first drain select line DSL0 is a selected drain line and the first word line WL1 is a selected word line, a page coupled to the first drain select line DSL0 among a plurality of pages PG coupled to the first word line WL1 becomes a selected page. Pages which are commonly coupled to the first word line WL1 but are coupled to the unselected second and fourth drain select lines DSL1 to DSL3 become unselected pages.

Although a case where one source select transistor SST and one drain select transistor DST are included in one string ST is illustrated in the drawings, a plurality of source select transistors SST and a plurality of drain select transistors DST may be included in one string ST, depending on a semiconductor memory. In addition, dummy cells may be included between the source select transistor SST, the memory cells F1 to Fn, and the drain select transistor DST, depending on a semiconductor memory. The dummy cells do not store user data, like general memory cells F1 to Fn, but may be used to improve electrical characteristics of each string ST. However, the dummy cells are not important components in this embodiment, and therefore, their detailed descriptions will be omitted.

Figure 6:
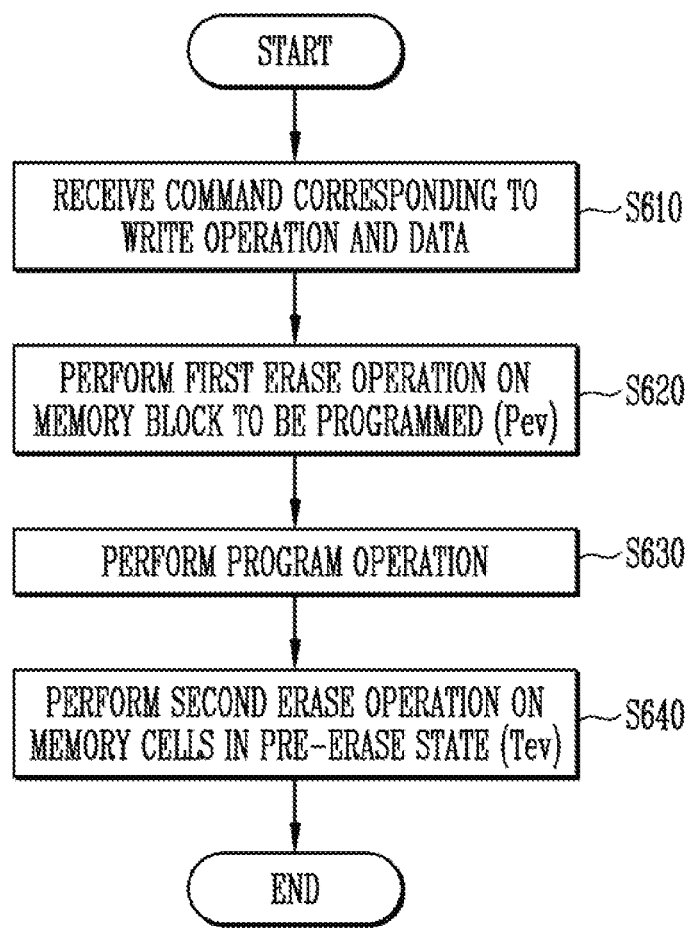
FIG. 6 is a flowchart illustrating a write operation of a semiconductor memory in accordance with an embodiment of the present disclosure.

FIG. 6 is a flowchart illustrating a write operation of the semiconductor memory in accordance with an embodiment of the present disclosure.

A write operation of the semiconductor memory will be described as follows with reference to FIGS. 1 to 6.

Referring to FIG. 6, the semiconductor memory 100 receives a command CMD corresponding to a write operation and data DATA to be programmed from the outside (e.g., the controller 1200 shown in FIG. 1) (S610). The semiconductor memory 100 may receive an address ADDR together with the command CMD and the data DATA to be programmed.

The semiconductor memory 100 may perform a first erase operation, a program operation, and a second erase operation in response to the command CMD corresponding to the write command.

The semiconductor memory 100 performs the first erase operation on a selected memory block (e.g., BLK1) on which the program operation is to be performed among a plurality of memory blocks BLK1 to BLKz (S620). The selected memory block BLK1 may be a memory block in which invalid data is stored. Memory cells included in the selected memory block BLK1 on which the first erase operation is performed are erased to a pre-erase state, and the memory cells in the pre-erase state may have a threshold voltage equal to or lower than a pre-erase threshold voltage Pev.

The first erase operation may be performed using a Gate Induced Drain Leakage (GIDL) erase method by applying an erase voltage Vers to a source line. In the first erase operation, the voltage generating circuit 150 generates an erase voltage Vers and then applies the erase voltage Vers to a source line SL of the selected memory block, and generates and outputs a plurality of source select line voltages $V_{SSL0}$ and $V_{SSL1}$, under the control of the voltage generating circuit control signals VG_signals generated by the control logic 140. The address decoder 120 applies the plurality of source select line voltages $V_{SSL0}$ and $V_{SSL1}$ to a plurality of source select lines SSL0 and SSL1 of the selected memory block BLK1. Therefore, a GIDL current is generated by the erase voltage Vers through the source line SL in a lower channel of source select transistors SST of the selected memory block BLK1, and hot holes generated by the GIDL current are supplied to a channel layer of a plurality of strings. Subsequently, when the address decoder 120 discharges a potential level of word lines WL1 to WLn to a ground voltage level, a voltage difference between the word lines WL1 to WLn and a channel of strings included in the selected memory block BLK1 is sufficiently increased, and therefore, electrons trapped in a charge storage layer of memory cells F1 to Fn included in the selected memory block BLK1 are discharged to the channel, thereby decreasing a threshold voltage.

Subsequently, it is determined whether the threshold voltage of the memory cells F1 to Fn is equal to or lower than the pre-erase threshold voltage Pev, by performing an erase verify operation, and the erase operation using the GIDL erase method is re-performed by increasing the erase voltage Vers when the threshold voltage of the memory cells F1 to Fn is higher than the pre-erase threshold voltage Pev. When the threshold voltage of the memory cells F1 to Fn is equal to or lower than the pre-erase threshold voltage Pev, the semiconductor memory 100 completes the first erase operation (S620).

When the first erase operation (S620) is completed, the semiconductor memory 100 performs the program operation on the selected memory block BLK1 (S630). The program operation may be performed in units of pages. That is, the semiconductor memory 100 performs the program operation of a selected page among a plurality of pages included in the selected memory block.

The plurality of page buffers PB1 to PBm included in the read/write circuit 130 temporarily store data DATA to be programmed, which is received from the outside (e.g., the controller 1200 shown in FIG. 1) in the write operation.

In the program operation, the plurality of page buffers PB1 to PBm control a potential level of the bit lines BL1 to BLm to a program inhibit voltage or program allow voltage according to the temporarily stored data DATA in response to the page buffer control signals PB_signals. For example, the program inhibit voltage may be a power voltage level, and the program allow voltage may be a voltage having a level lower than a voltage of the ground voltage or the program inhibit voltage.

Subsequently, the voltage generating circuit 150 generates a program voltage Vpgm and a pass voltage Vpass under the control of the voltage generating circuit control signals VG_signals generated by the control logic 140. The address decoder 120 applies the program voltage Vpgm to a selected word line corresponding to the selected page of the selected memory block BLK1 and applies the pass voltage Vpass to unselected word lines, thereby performing the program operation.

When the program operation (S630) of the selected page is completed, the semiconductor memory 100 performs the second erase operation on memory cells to be programmed in an erase state among the memory cells included in the selected page (S640). The second erase operation may be performed using the GIDL erase method by applying an erase voltage to selected bit lines among the bit lines. The memory cells to be programmed in the erase state may be in the pre-erase state due to the first erase operation. The second erase operation erases the memory cells in the pre-erase state in a state in which a threshold voltage of the memory cells in the pre-erase state is equal to or lower than a target erase threshold voltage Tev. The target erase threshold voltage Tev may have a voltage level lower than a voltage level of the pre-erase threshold voltage Pev.

In the write operation of the semiconductor memory, a selected memory block is programmed in units of pages. Therefore, a memory block including a plurality of pages performs the program operation (S630) on a selected page among the plurality of pages, and performs the second erase operation (S640) on the selected page. Subsequently, the program operation (S630) and the second erase operation (S640) are sequentially performed on a next selected page. That is, the first erase operation (S620) may be performed in units of blocks, and the program operation (S630) and the second erase operation (S640) may be performed in units of pages.

Figure 7:
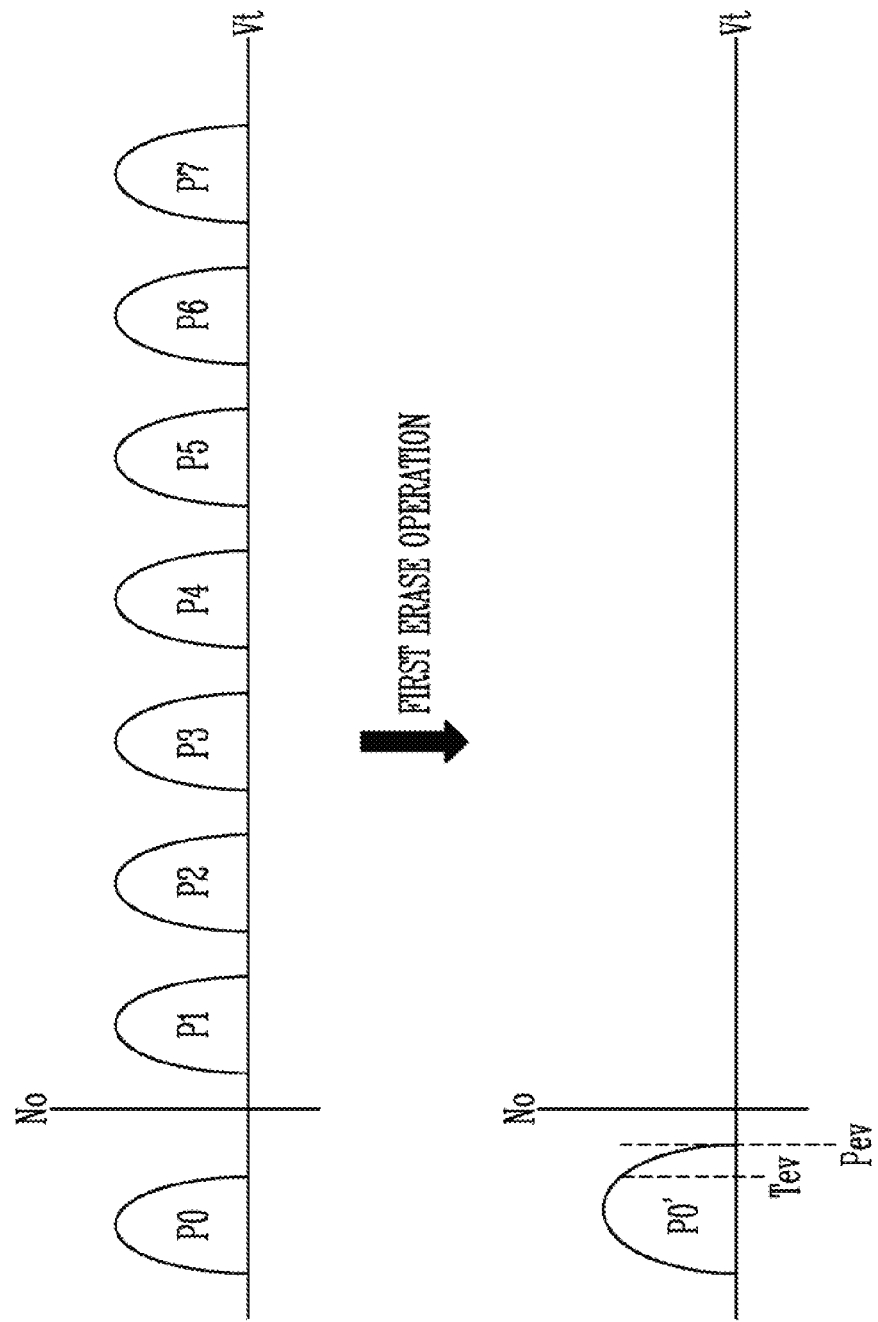
FIG. 7 is a threshold voltage distribution diagram of memory cells, illustrating a first erase operation shown in FIG. 6.

FIG. 7 is a threshold voltage distribution diagram of memory cells, illustrating the first erase operation shown in FIG. 6.

Referring to FIG. 7, a memory block selected as a memory block on which the program operation is to be performed in the write operation may be in a state in which valid data corresponding to an erase state P0 and a plurality of program states P1 to P7 are stored. Accordingly, the first erase operation (S620 shown in FIG. 6) is performed such that memory cells included in the selected memory block have a threshold voltage distribution of a pre-erase state P0'.

The threshold voltage distribution of the pre-erase state P0' is equal to or lower than the pre-erase threshold voltage Pev, and a portion of the threshold voltage distribution of the pre-erase state P0' may be higher than the target erase threshold voltage Tev. The threshold voltage distribution of the pre-erase state P0' has a threshold voltage distribution higher than a normal erase state (e.g., a threshold voltage distribution state equal to or lower than the target erase threshold voltage Tev).

Figure 8:
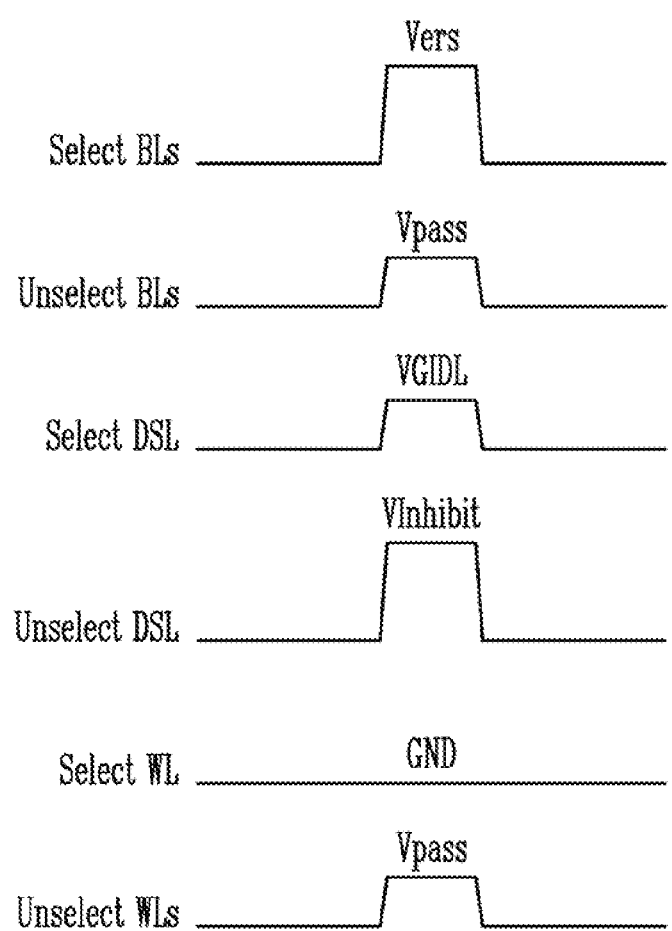
FIG. 8 is a waveform diagram of operation voltages, illustrating a second erase operation shown in FIG. 6.

FIG. 8 is a waveform diagram of operation voltages, illustrating the second erase operation shown in FIG. 6.

Referring to FIGS. 2 and 8, in the second erase operation in units of pages, the read/write circuit 130 applies an erase voltage Vers to selected bit lines Select BLs among the plurality of bit lines BL1 to BLm, and applies a pass voltage Vpass to unselected bit lines Unselect BLs. The selected bit lines Select BLs are bit lines corresponding to memory cells to be programmed to an erase state in the write operation, and the unselected bit lines Unselect BLs are bit lines corresponding to memory cell to be programmed to a plurality of program states. The read/write circuit 130 may apply the erase voltage Vers or the pass voltage Vpass to each of the plurality of bit lines BL1 to BLm in the second erase operation, based on data DATA received to be temporarily stored in the write operation.

In the second erase operation, the voltage generating circuit 150 generates a plurality of drain select line voltages $V_{DSL0}$, $V_{DSL1}$, $V_{DSL2}$, and $V_{DSL3}$, and the address decoder 120 applies the plurality of drain select line voltages $V_{DSL0}$, $V_{DSL1}$, $V_{DSL2}$, and $V_{DSL3}$ to the plurality of drain select lines DSL0 to DSL3 of the selected memory block BLK1. An erase operation voltage VGIDL for generating a GIDL current is applied to a drain select line Select DSL corresponding to a selected page, and an erase inhibit voltage Vinhibit for preventing generation of the GIDL current is applied to the other unselected drain select lines Unselect DSL. The operation voltage VGIDL may be a voltage lower than the inhibit voltage Vinhibit. Therefore, the GIDL current is generated when the erase voltage Vers is applied through a corresponding bit line among selected drain select transistors DST, and is not generated when the pass voltage Vpass is applied through the corresponding bit line. That is, hot holes generated by the GIDL current are supplied to the channel layer in only a string which corresponds to the bit line to which the erase voltage Vers is applied, and includes the selected drain select transistor among the plurality of strings.

The voltage generating circuit 150 generates and outputs a pass voltage Vpass. The address decoder 120 controls a word line Sel WL corresponding to the selected page among the word lines WL1 to WLn by using a ground voltage GND, and applies the pass voltage Vpass generated by the voltage generating circuit 150 to unselected word lines Unselect WLs.

Thus, only selected memory cells (memory cells to be programmed to the erase state) among the memory cells included in the selected page can be selectively erased, and the erase operation on the other unselected memory cells can be suppressed.

In the second erase operation, the source select lines SSL0 and SSL1 and the source line SL may be controlled to a floating state.

The erase voltage Vers applied to the bit lines in the second erase operation may be a voltage having a potential level higher than a potential level of the erase voltage Vers applied through the source line SL in the first erase operation. Therefore, the memory cells erased in the pre-erase state as a result obtained by performing the first operation may be erased to a target erase state in which the memory cells have a threshold voltage distribution lower than a threshold voltage distribution of the pre-erase state in the second erase operation.

Figure 9:
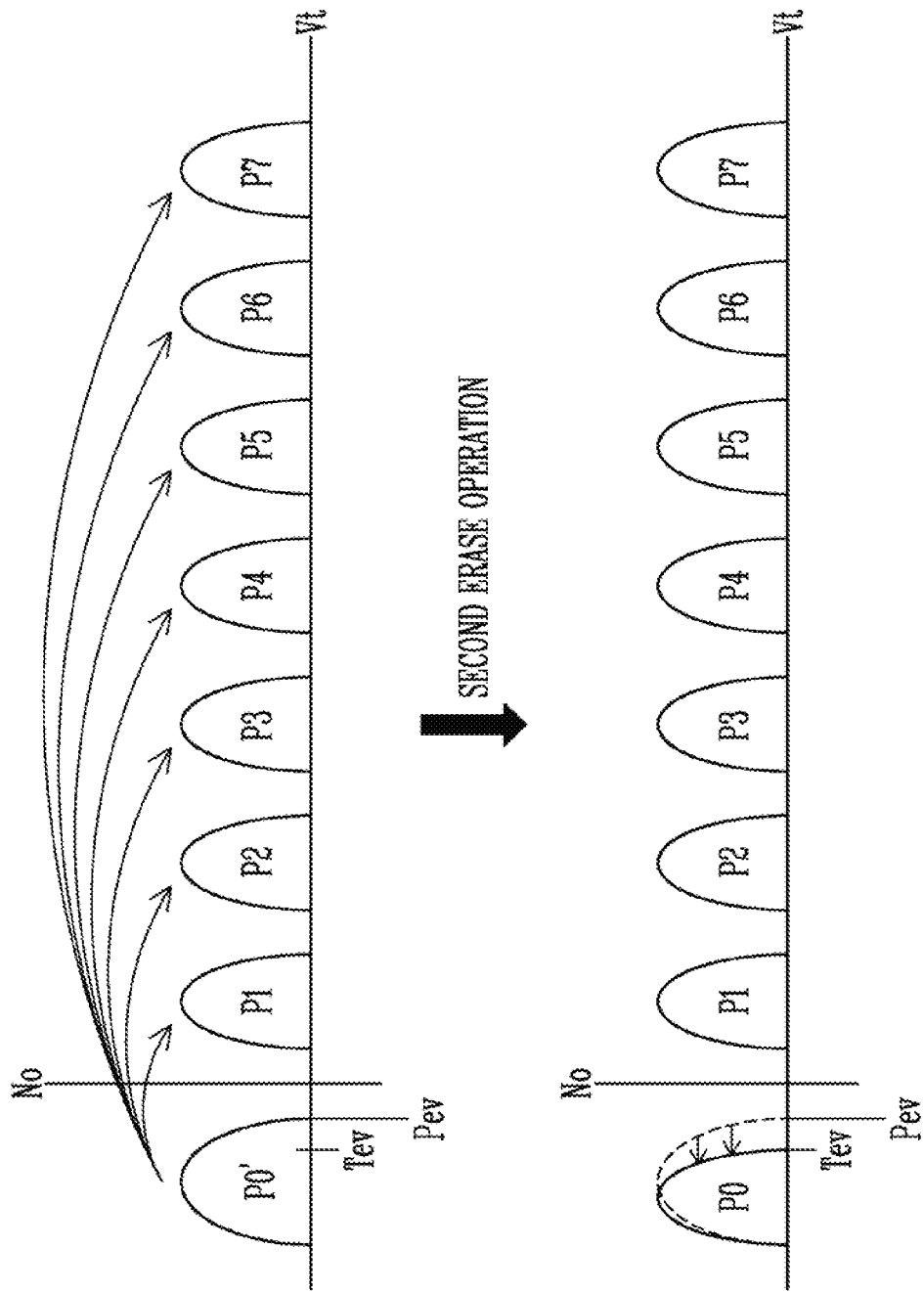
FIG. 9 is a threshold voltage distribution diagram of memory cells, illustrating a program operation and the second erase operation, which are shown in FIG. 6.

FIG. 9 is a threshold voltage distribution diagram of memory cells, illustrating the program operation and the second erase operation, which are shown in FIG. 6.

Referring to FIG. 9, in the program operation (S630) shown in FIG. 6, memory cells are programmed to the pre-erase state P0' and the plurality of program states P1 to P7.

Subsequently, in the second erase operation, the memory cells in the pre-erase state P0' may be erased to a target erase state P0. The target erase state P0 may have a threshold voltage distribution lower than a threshold voltage distribution of the pre-erase state P0'.

As described above, in accordance with an embodiment of the present disclosure, the second erase operation is selectively performed on the memory cells in the pre-erase state after the program operation is completed, so that the threshold voltage distribution of the memory cells in the erase state is further decreased. Thus, in the memory blocks on which the write operation is completed, the interval between threshold voltage distributions of the lowest program state (e.g., P1) and the erase state P0 among the program states is increased, so that stability is ensured in a read operation of the semiconductor memory.

Figure 10:
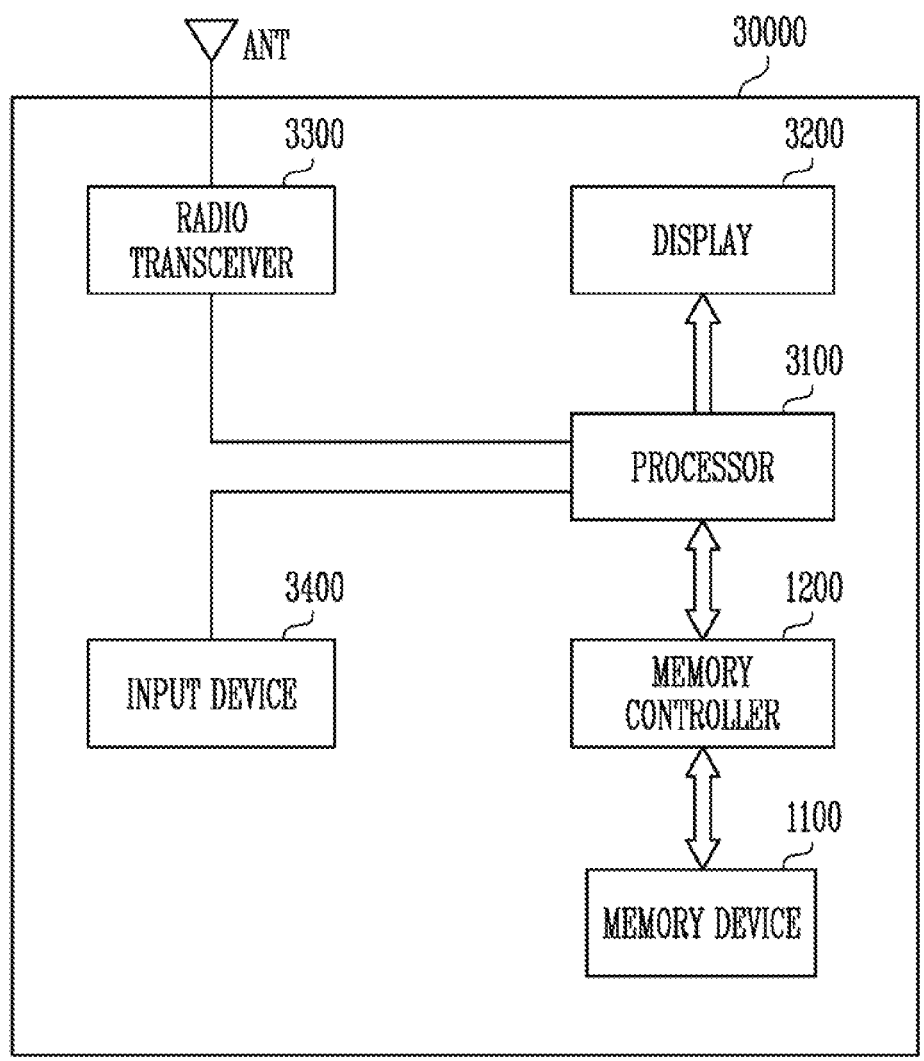
FIG. 10 is a diagram illustrating another embodiment of a memory system.

FIG. 10 is a diagram illustrating another embodiment of a memory system.

Referring to FIG. 10, a memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the controller 1200 shown in FIG. 1.

Figure 11:
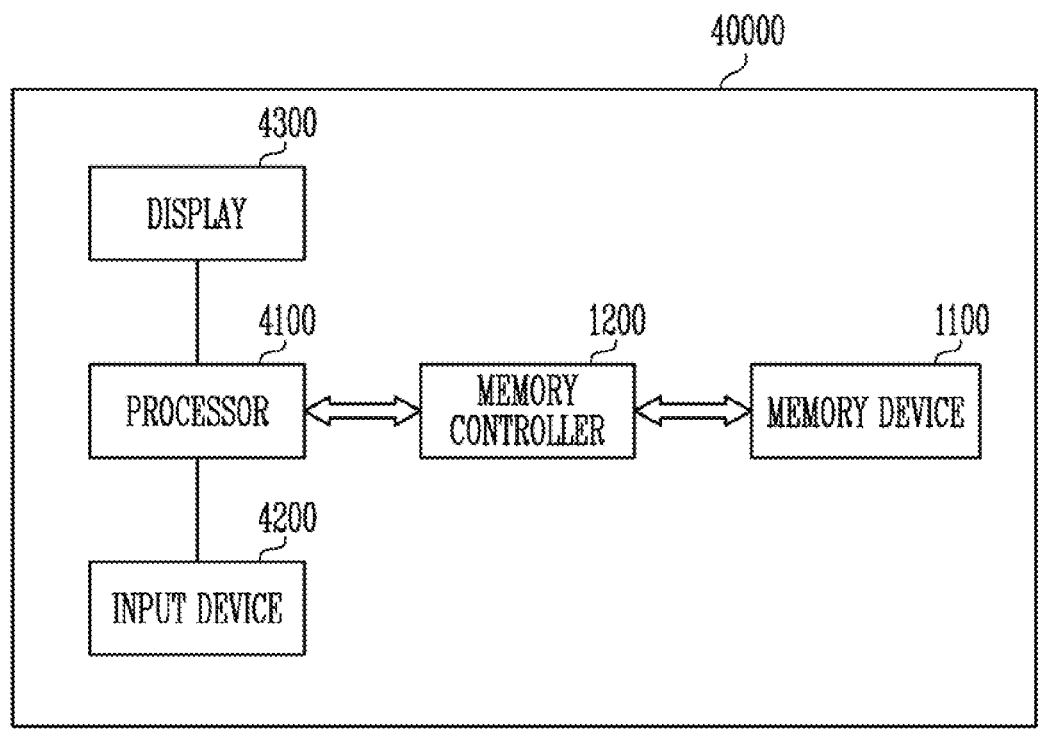
FIG. 11 is a diagram illustrating another embodiment of a memory system.

FIG. 11 is a diagram illustrating another embodiment of a memory system.

Referring to FIG. 11, a memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the controller 1200 shown in FIG. 1.

Figure 12:
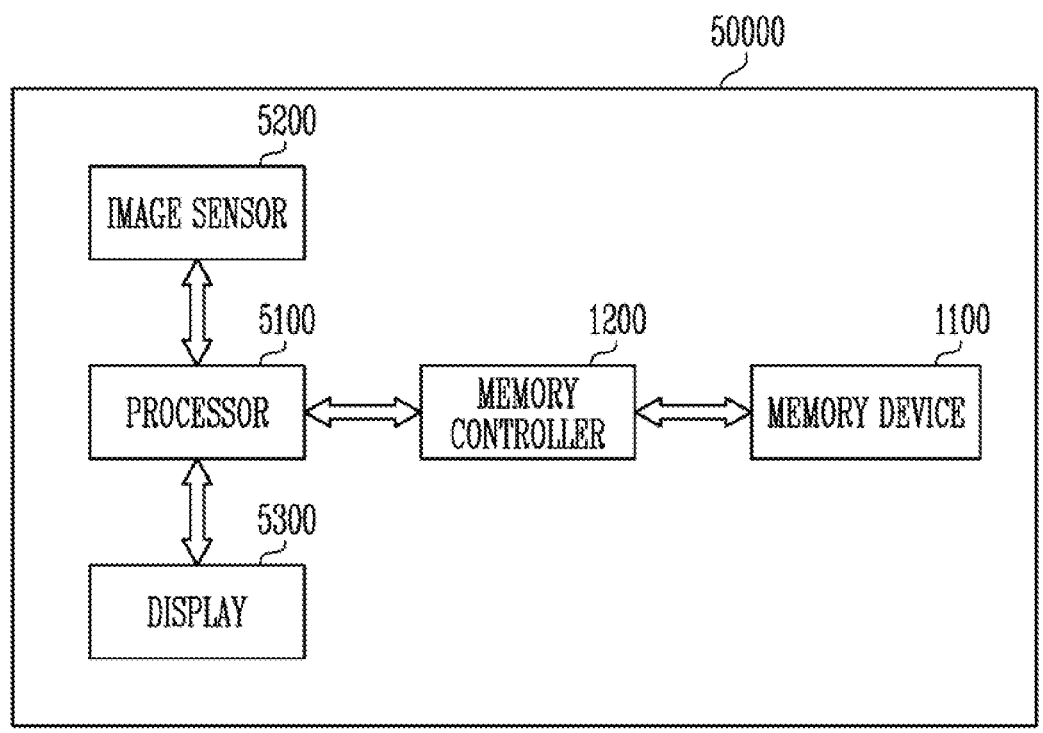
FIG. 12 is a diagram illustrating another embodiment of a memory system.

FIG. 12 is a diagram illustrating another embodiment of a memory system.

Referring to FIG. 12, a memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the controller shown in FIG. 1.

Figure 13:
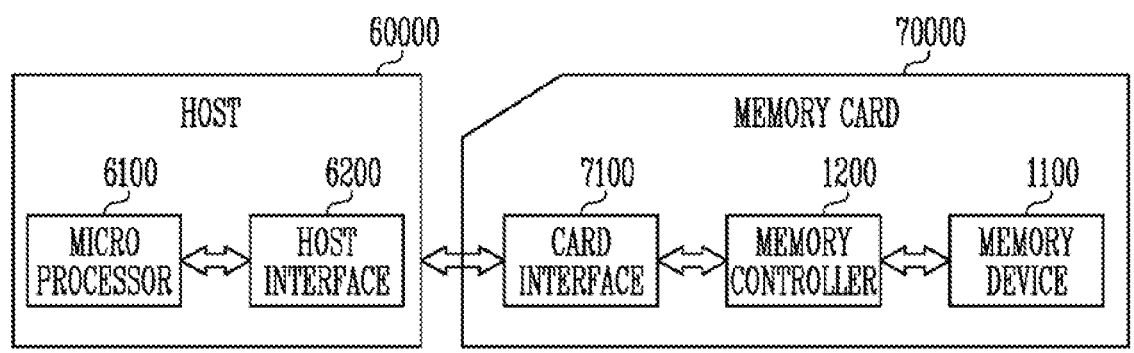
FIG. 13 is a diagram illustrating another embodiment of a memory system.

FIG. 13 is a diagram illustrating another embodiment of a memory system.

Referring to FIG. 13, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the controller 1200 shown in FIG. 1.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, an additional erase operation on memory cells corresponding to an erase state is performed after a program operation is performed, so that data reliability can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory comprising:
   a memory block including a plurality of pages;
   a peripheral circuit configured to perform a first erase operation, a program operation, and a second erase operation on the memory block in a write operation on the memory block; and
   control logic configured to control the peripheral circuit to perform the write operation,
   wherein the control logic is configured to control the peripheral circuit to erase a plurality of memory cells included in the memory block to a pre-erase state having a threshold voltage higher than a threshold voltage of a target erase state in the first erase operation, and control the peripheral circuit to erase some memory cells among the plurality of memory cells to the target erase state in the second erase operation.

2. The semiconductor memory of claim 1, wherein the memory block is configured to be in a state in which valid data are stored before the first erase operation is performed.

3. The semiconductor memory of claim 1, wherein the peripheral circuit is configured to perform the first erase operation, using a Gate Induced Drain Leakage (GIDL) erase method, by applying a first erase voltage to a source line coupled to the memory block.

4. The semiconductor memory of claim 3, wherein the peripheral circuit is configured to perform the second erase operation, using the GIDL erase method, by applying a second erase voltage to selected bit lines among bit lines coupled to the memory block.

5. The semiconductor memory of claim 4, wherein, in the second erase operation, the peripheral circuit is configured to:
apply the second erase voltage to the selected bit lines corresponding the some memory cells to be erased to the target erase state among the bit lines;
apply an erase operation voltage to a drain select line coupled to the memory block; and
apply a ground voltage to a word line corresponding to the some memory cells.

6. The semiconductor memory of claim 5, wherein, in the second erase operation, the peripheral circuit is configured to control the source line and a source select line coupled to the memory block to a floating state.

7. The semiconductor memory of claim 5, wherein, in the second erase operation, the peripheral circuit is configured to apply a pass voltage to the other bit lines except the selected bit lines among the bit lines.

8. The semiconductor memory of claim 7, wherein the other bit lines are bit lines corresponding to memory cells programmed to a plurality of program states in the program operation.

9. The semiconductor memory of claim 4, wherein the second erase voltage is a voltage higher than the first erase voltage.

10. The semiconductor memory of claim 4, wherein the peripheral circuit is configured to perform the first erase operation in units of blocks, and perform the program operation and the second erase operation in units of pages.

11. The semiconductor memory of claim 6, wherein the peripheral circuit is configure to, after performing the first erase operation:
sequentially perform the program operation and the second erase operation on a selected page among the plurality of pages; and
sequentially perform the program operation and the second erase operation on a next page.

12. A method for operating a semiconductor memory, the method comprising:
performing a first erase operation on a memory block including a plurality of pages;
performing a program operation on a selected page among the plurality of pages; and
performing a second erase operation on some memory cells among memory cells included in the selected page,
wherein memory cells included in the memory block are erased to a pre-erase state in the first erase operation, and the some memory cells are erased to a target erase state in the second erase operation.

13. The method of claim 12, wherein the pre-erase state has a threshold voltage distribution higher than a threshold voltage distribution of the target erase state.

14. The method of claim 12, wherein the first erase operation is performed, using a Gate Induced Drain Leakage (GIDL) erase method, by applying a first erase voltage to a source line coupled to the memory block, and
the second erase operation is performed, using the GIDL erase method, by applying a second erase voltage to some bit lines among bit lines coupled to the memory block.

15. A method for operating a semiconductor memory, the method comprising:
providing a memory block including a plurality of pages, wherein each of the plurality of pages includes memory cells programmed to a pre-erase state and a plurality of program states;
applying an erase voltage to first bit lines coupled to first memory cells corresponding to the pre-erase state among the memory cells included in a selected page among the plurality of pages;
applying an erase operation voltage to a drain select line of the memory block; and
erasing the first memory cells included in the selected page to a target erase state having a threshold voltage distribution lower than a threshold voltage distribution of the pre-erase state by applying a ground voltage to a selected word line corresponding to the selected page.

16. The method of claim 15, further comprising applying a pass voltage to second bit lines coupled to second memory cells corresponding to the plurality of program states among the memory cells included in the selected page.

17. The method of claim 15, wherein a source line and a source select line, which are coupled to the memory block, are controlled to a floating state.

18. The method of claim 15, wherein a pass voltage is applied to unselected word lines corresponding to unselected pages among the plurality of pages.

* * * * *